US 9,824,978 B2

(12) United States Patent
Ramakrishnan

(10) Patent No.: US 9,824,978 B2
(45) Date of Patent: Nov. 21, 2017

(54) CONNECTION PATTERNS FOR HIGH-DENSITY DEVICE PACKAGING

(71) Applicant: Avago Technologies General IP (Singapore) Pte. Ltd., Singapore (SG)

(72) Inventor: Arun Ramakrishnan, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/820,195

(22) Filed: Aug. 6, 2015

(65) Prior Publication Data

US 2017/0033054 A1  Feb. 2, 2017

Related U.S. Application Data

(60) Provisional application No. 62/199,575, filed on Jul. 31, 2015.

(51) Int. Cl.
*H01L 23/552* (2006.01)
*H01L 23/498* (2006.01)

(52) U.S. Cl.
CPC ...... *H01L 23/552* (2013.01); *H01L 23/49816* (2013.01); *H01L 2224/16225* (2013.01); *H01L 2224/16227* (2013.01); *H01L 2224/73253* (2013.01); *H01L 2924/15311* (2013.01); *H01L 2924/16251* (2013.01)

(58) Field of Classification Search
None
See application file for complete search history.

(56) References Cited

U.S. PATENT DOCUMENTS

2012/0068339 A1* 3/2012 Miller ............... H01L 23/49838
257/738
2017/0005056 A1* 1/2017 Fai ...................... H01L 23/5384

OTHER PUBLICATIONS

Assembly Guidelines for MAPBGA (Molded Array Process Ball Grid Array) Package Document No. AN4982. Rev 2. Sep. 2014, pp. 1-21, Freescale Semiconductor, Inc., Austin, TX.
Ball Grid Array (BGA) Packaging, 2000 Packaging Databook, Chapter 14, 2000, pp. 14-1-14-32, Intel Corporation, Santa Clara, CA.
Flip Chip Ball Grid Array Package Reference Guide, May 2005, pp. 1-72, Texas Instruments Incorporated, Dallas, TX.

* cited by examiner

*Primary Examiner* — Cuong Q Nguyen
(74) *Attorney, Agent, or Firm* — Foley & Lardner LLP

(57) ABSTRACT

Connection patterns for device packaging allow high density circuitry dies to be assembled into packages of manufacturable size. The connection patterns may be patterns for solder ball arrays or other types of connection mechanisms under a semiconductor package. Despite the increased density of the connection patterns, the connection patterns meet the demanding crosstalk specifications for high speed operation of the high density circuitry.

20 Claims, 9 Drawing Sheets

CONNECTION PATTERNS FOR HIGH-DENSITY DEVICE PACKAGING

PRIORITY CLAIM

This application claims priority to provisional application Ser. No. 62/199,575, filed Jul. 31, 2015, which is entirely incorporated by reference.

TECHNICAL FIELD

This disclosure relates to semiconductor packaging. This disclosure also relates to ball grid patterns for semiconductor packages.

BACKGROUND

Rapid advances in electronics and communication technologies, driven by immense customer demand, have resulted in the widespread adoption of electronic devices of every kind. The fabrication processes that create the device circuitry on semiconductor dies have transitioned through many different manufacturing process nodes in the last four decades, from 6 µm processes in the mid-1970s to 10 nm processes targeted for 2016-2017. The ever increasing density, functionality, and complexity of the circuitry has given rise to significant challenges with the semiconductor packaging that carries the dies, including challenges with mechanically and electrically connecting the semiconductor packaging to external system circuitry.

DETAILED DESCRIPTION

The connection patterns for device packaging that are discussed below allow high density circuitry dies to be assembled into packages of manufacturable size. The connection patterns may be patterns for solder ball arrays or other types of electrical connection mechanisms under a semiconductor package. Despite the increased density of the connection patterns, the connection patterns still meet the demanding crosstalk specifications for high speed transmit and receive signaling performed through the connection pattern to and from the high density circuitry on the die within the packaging.

Figure 1:
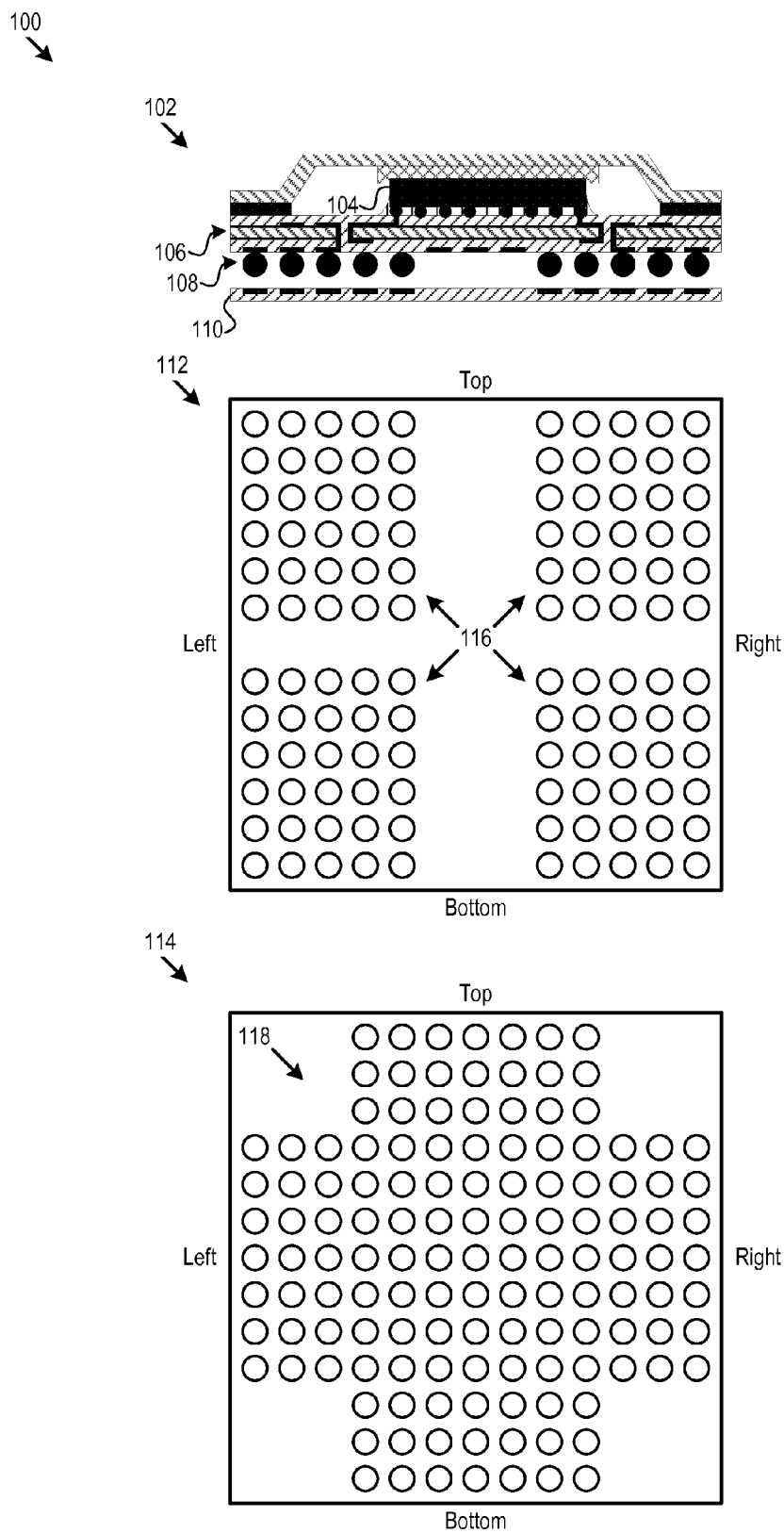
FIG. 1 shows examples of semiconductor packages.

FIG. 1 shows examples 100 of semiconductor packages. FIG. 1 shows a package cross section 102 including circuit layers defined on substrates that are bonded together and that use, e.g., vias to interconnect the circuit layers. The package cross section 102 shows the die 104 bonded to circuit layers 106. The circuit layers 106 connect to a connection pattern 108, e.g., on the bottom of the package. In this case, the connection pattern 108 is a ball grid array (BGA) of solder balls as the conductive elements through which the package is soldered to land patterns on a printed circuit board (PCB) 110. The principles discussed below are applicable to other types of connection patterns composed of other types of electrically connecting elements, including pin grid arrays (PGAs) of pins, land grid arrays (LGAs) of planar metal contacts, and other types of connection mechanisms. Furthermore, the principles discussed below are applicable to any circuitry subject to signal performance specifications, in addition to the specific type of communication circuits described below.

FIG. 1 also shows two examples of package bottom views, the package bottom view 112 and the package bottom view 114. The connection patterns generally extend over a two dimensional plane along the top, bottom, left, and right sides of the package, e.g., as shown in the example connection patterns 116 and 118. There is an immense space of possible connection patterns for any package with more than just a handful of connection points.

Allocating signal connections, power connections, and ground connections to the connection points (whether solder balls, pins, or lands) within the connection pattern is a significant technical challenge for high speed circuits. For instance, high speed serializer/deserializer (SERDES) cores must meet stringent specifications for signal performance to ensure reliable operation, specifically far-end and near-end crosstalk (FEXT and NEXT) specifications. Additional signal performance specifications that may be applicable include Tx and Rx return loss (RL), Tx and Rx common mode (CM) RL, and Tx and Rx FEXT measured at the PCB.

A significant complication to the allocation of signals is that the overall package size must be kept to a manufacturable size, but increasing the density of the connection pattern to reduce the package size adversely affects signal performance. As circuit speed increases, the signal specifications become more severe, and as the number of circuit cores on a die in a package increase, the challenge of finding a viable connection pattern that is manufacturable and that meets the signal specifications becomes extremely difficult. Note also that achieving a smaller package size also significantly reduces manufacturing costs. Reducing package size from 60 mm to 55 mm, for instance, may result in per-package savings of as much as $10.

Another factor influencing signal specifications is the effective receive distance with regard to signal sent from a communication partner to the package, e.g., over circuit traces on the PCB. The effective distances are sometimes categorized as long reach or short reach. An insertion loss of 30 dB or better between the package and a communication partner may represent a short reach, while an insertion loss of greater than 30 dB may represent a long reach. For short reach implementations, the receive signal specifications typically allow greater cross talk because the received signals are stronger, while long reach implementations need to meet a more conservative receive cross talk specification because the received signals are weaker and more readily corrupted by noise and interference.

Figure 2:
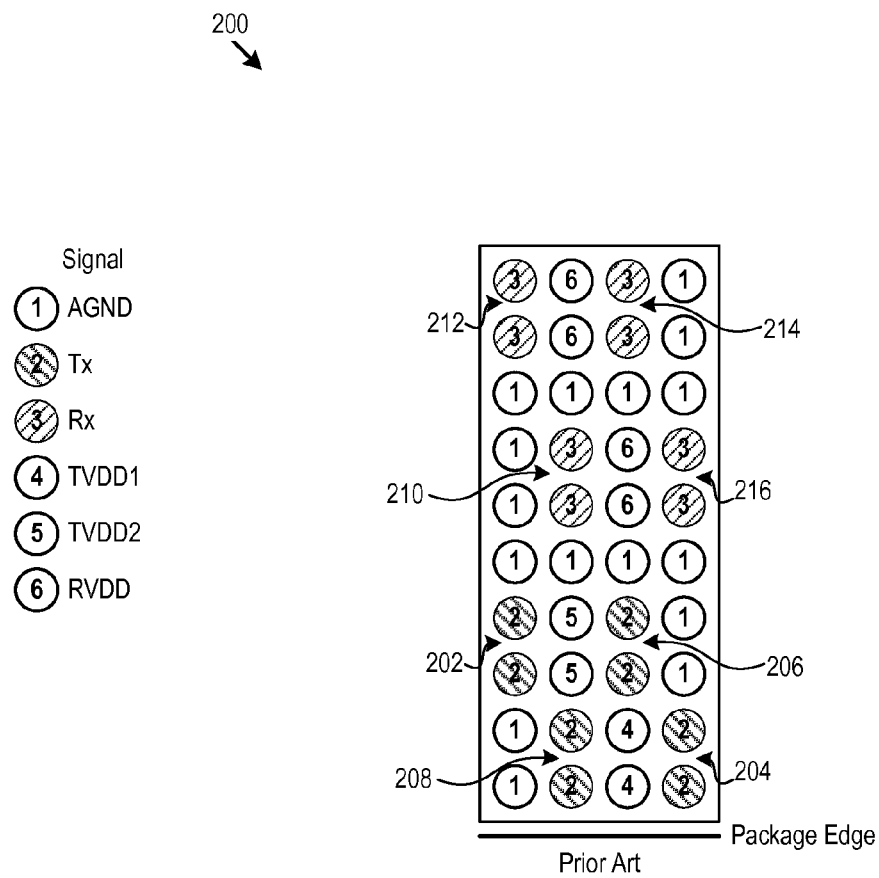
FIG. 2 is an example of a prior ball pattern.

FIG. 2 is an example of a prior ball pattern 200 for one instance of a SERDES core. The examples below assume that a core instance includes four differential Tx pairs and four differential Rx pairs, power supply, and ground signals. In FIG. 2 shows the four Tx pairs 202, 204, 206, and 208, and the four Rx pairs 210, 212, 214, and 216. The power supply signals include a TVDD1 signal and a TVDD2 signal that provide two different transmit power supply voltages, e.g., 0.8V and 1.2V. The power supply signals also include a RVDD signal that provides a receive power supply voltage. The ground signals include an AGND signal which is analog ground.

Figure 3:
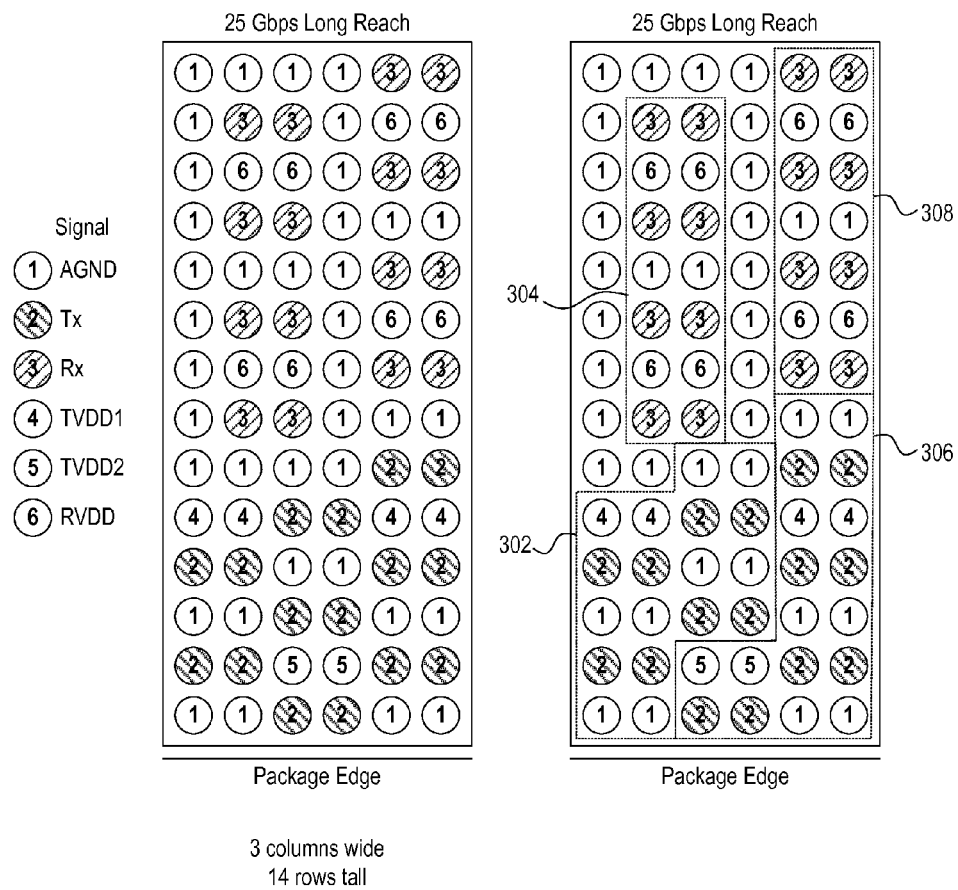
FIG. 3 is an example of a connection pattern for 25 Gbps long reach processing cores.

FIG. 3 is an example of a connection pattern 300. The connection pattern 300 may be used for 25 Gbps long reach SERDES processing cores, for instance. The connection pattern 300 shows the pattern for two instances of a SERDES core. As such the connection pattern 300 includes Tx signals 302 and Rx signals 304 for a first core, and Tx signals 306 and Rx signals 308 for a second core. Although the density of Tx signals is tighter in FIG. 3 as compared to FIG. 2, the arrangement in FIG. 3 achieves the same level of signal performance as was achieved in FIG. 2.

Figure 4:
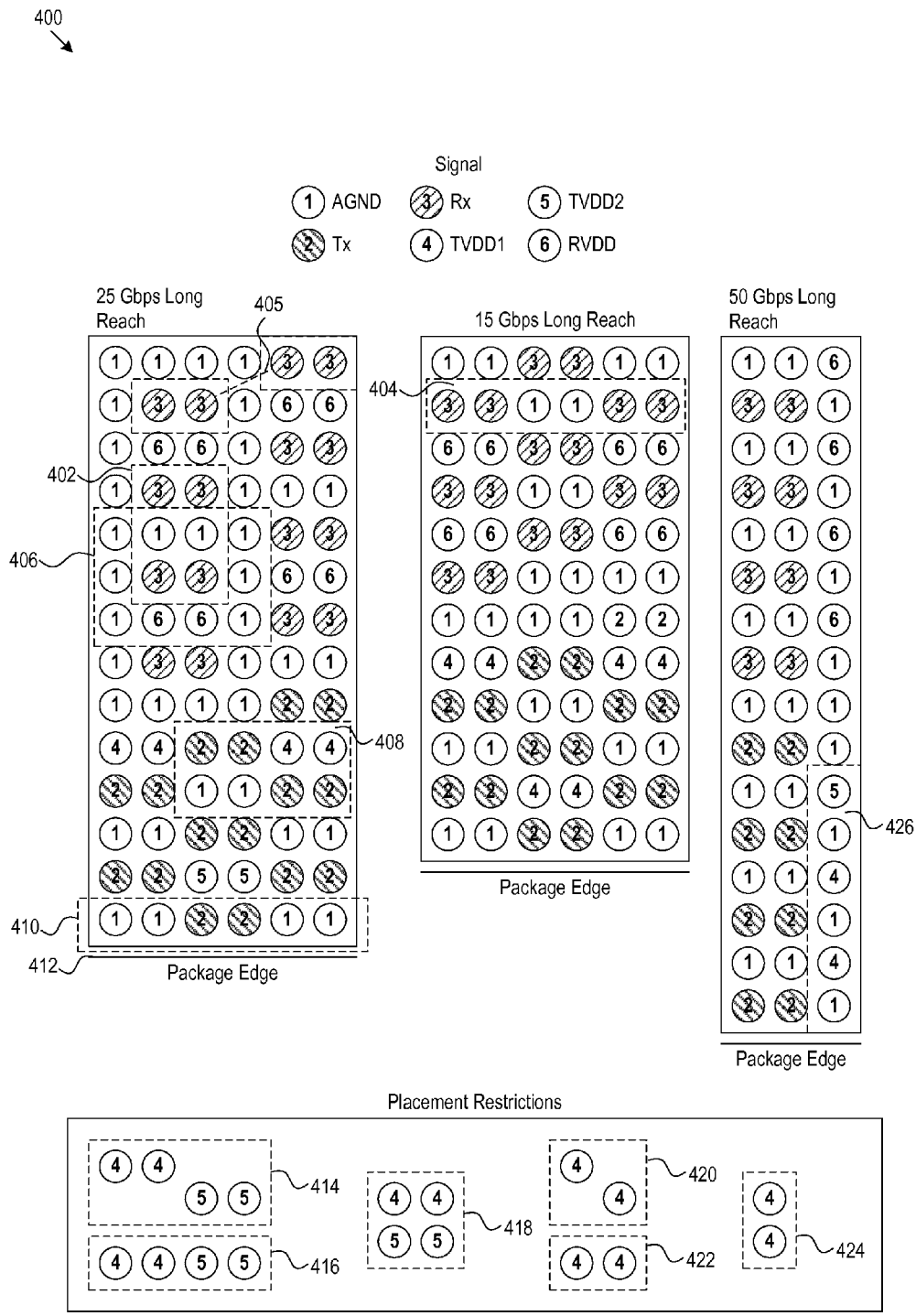
FIG. 4 shows examples of design rules.

The connection pattern 300, and the other connection patterns described below, may follow one or more specific design rules to help the connection patterns meet the signal specifications. Not all connection patterns need to follow the same rule or rules, and whether or not a given rule applies may depend on a speed threshold or other decision factor. For instance, a 15 Gbps long reach connection pattern may allow diagonal adjacency between Rx pairs, but not allow horizontal or vertical adjacency between the Rx pairs. On the other hand, a 25 Gbps long reach connection pattern may not allow any type of adjacency between Rx pairs. FIG. 4 illustrates the design rules 400, which are described in the following table:

then be placed adjacent to one another in a given direction along the edge of a package, to support additional sets of cores in multiples of four.

Figure 6:
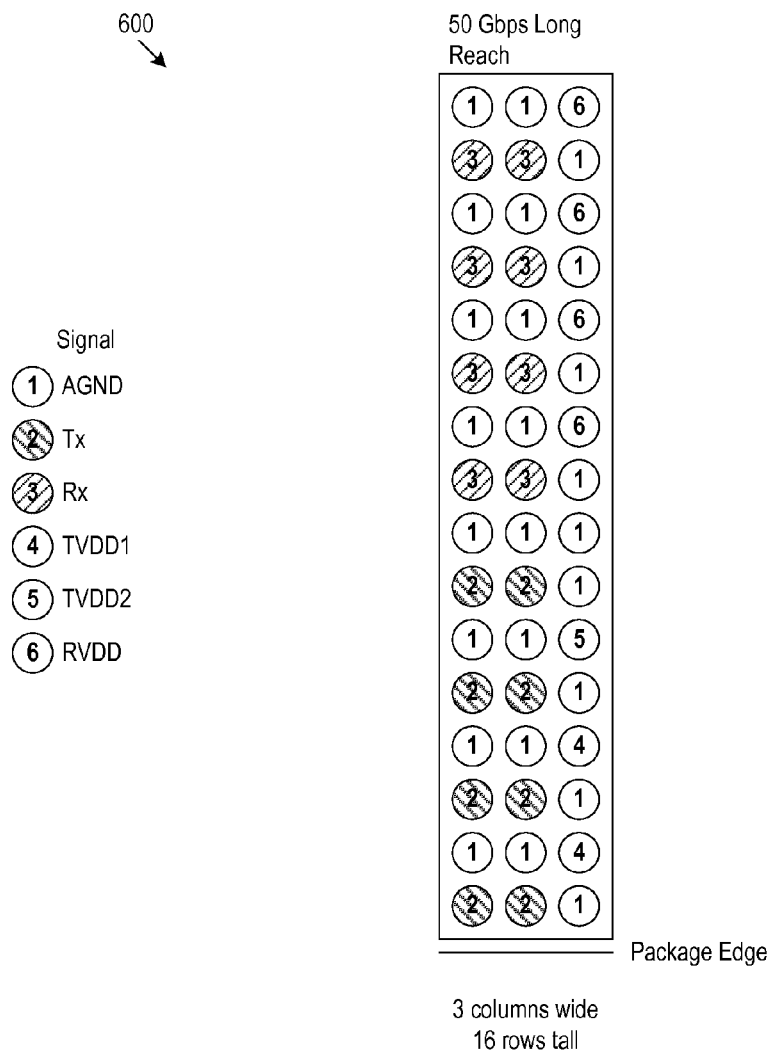
FIG. 6 is an example of a connection pattern for a 50 Gbps long reach processing core.

FIG. 6 is an example of a connection pattern 600 for a 50 Gbps long reach processing core. The connection pattern 600 supports one core with four Tx pairs and four Rx pairs. The connection pattern 600 meets many of the design rules explained above, including the VDD placement rule for high speed designs. As a result, no power connections have any adjacency in the connection pattern 600. In addition, the Tx and Rx pairs are separated vertically by ground connections, and when the connection pattern 600 is repeated horizontally to support more cores, the Tx and Rx pairs are separated horizontally by ground connections as well.

Figure 7:
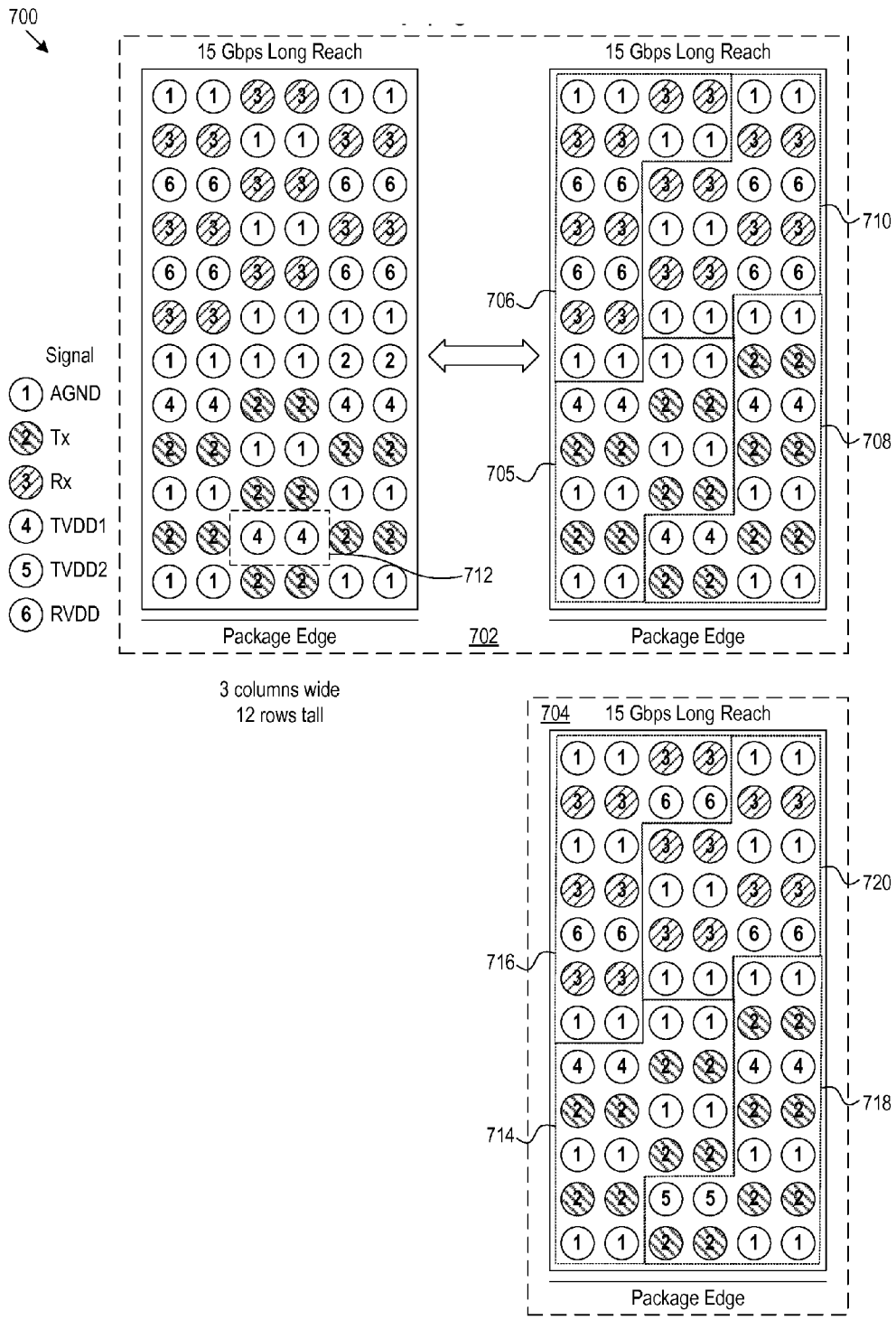
FIG. 7 is an example of a connection pattern for 15 Gbps short reach processing cores.

FIG. 7 is an example of connection patterns 700 for 15 Gbps long reach processing cores. There are two example connection patterns: the connection pattern 702 and the alternative connection pattern 704 which includes a different configuration for several RVDD and AGND pairs. FIG. 7 labels, in the connection pattern 702, the Tx signals 705 and Rx signals 706 for a first core, and Tx signals 708 and Rx signals 710 for a second core. Note that in this connection pattern there is no TVDD2 net. A TVDD2 connection may be added, for example, where indicated in FIG. 7 as the TVDD2 option 712 (as also shown in the alternative connection pattern 704). Similarly, the alternative connection pattern 704 includes Tx signals 714 and Rx signals 716 for a first core, and Tx signals 718 and Rx signals 720 for a second core

| Connection Pattern Design Rules | |
|---|---|
| Rule | Explanation |
| Rx pair placement | Rx pairs, which tend to carry weak received signals, are in a non-adjacent configuration, having any combination of vertical isolation 402, horizontal isolation 404, diagonal isolation 405, with respect to other Rx pairs. Rx pairs may also have surrounding isolation 406 in which the Rx pairs are surrounded by ground, power, or a combination or ground and power. |
| Tx pair placement | Tx pairs, which tend to carry strong transmit signals, may have some types of adjacency, e.g., diagonal adjacency 408 but not vertical or horizontal adjacency. |
| Package Edge | There are no VDD connections in the edge row 410 of the connection pattern that runs along the package edge 412, to help achieve improved EMI and CM RL performance. |
| VDD placement | Different power supply pairs (e.g., TVDD1 and TVDD2) are non-adjacent to reduce VDD plane resonance. That is, this rule may selectively restrict different power pairs to any of: no diagonal adjacency 414, no horizontal adjacency 416, and no vertical adjacency 418. |
| VDD placement | For certain designs above a speed threshold, e.g., 50 Gbps long reach designs, this rule may restrict the connection pattern so that the VDD connections are adjacency-free. That is, no VDD connection, even of the same type (e.g., TVDD1), may be adjacent to another VDD connection. This rule may selectively restrict the same power connections to any of: no diagonal adjacency 420, no horizontal adjacency 422, and no vertical adjacency 424. An implementation of this rule is seen in the power section 426 of the 50 Gbps long reach connection pattern. |

Figure 5:
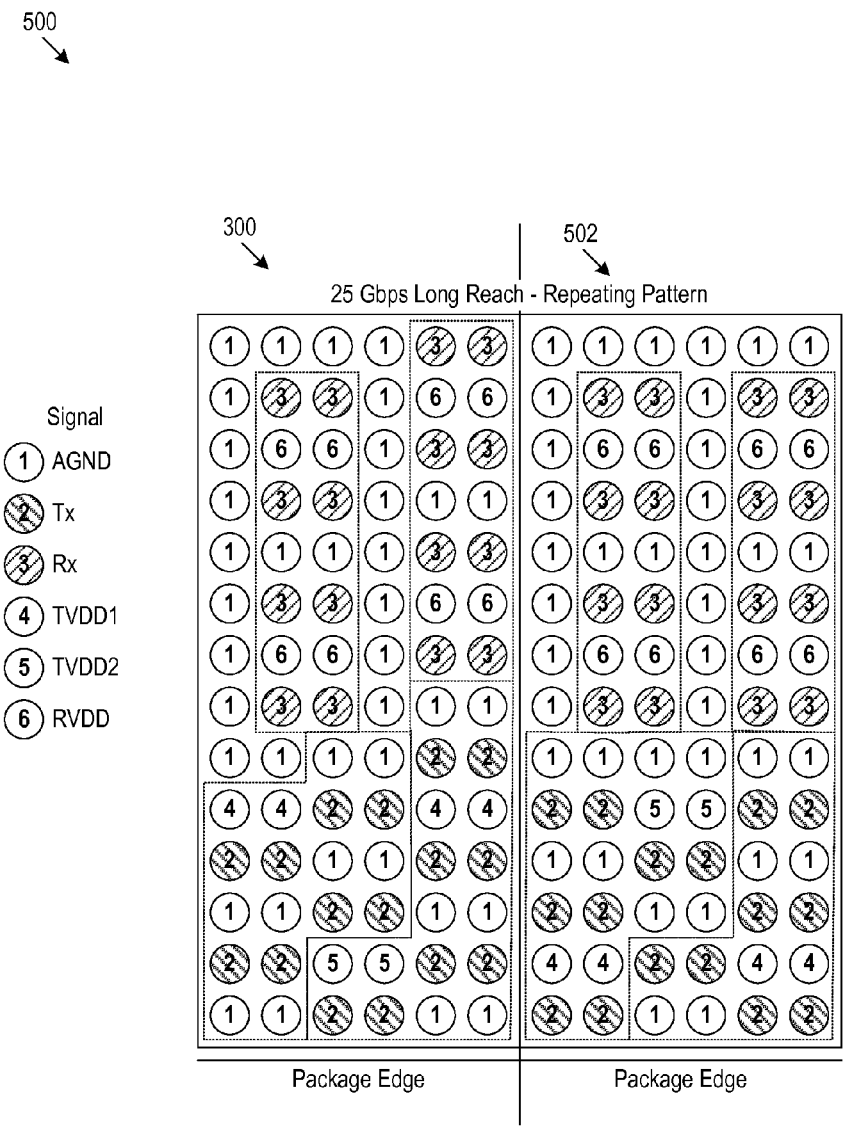
FIG. 5 is an example of a repeatable connection pattern for 25 Gbps long reach processing cores.
Figure 8:
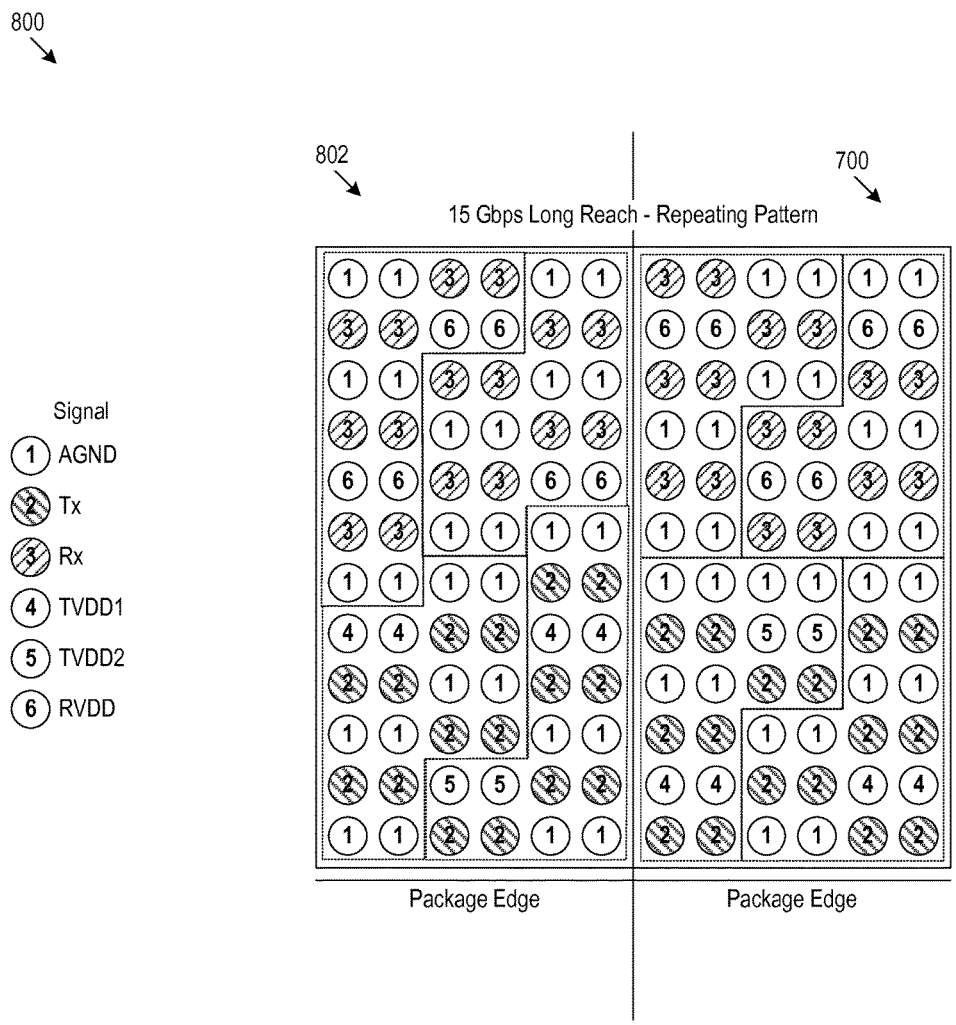
FIG. 8 is an example of a repeatable connection pattern for 15 Gbps long reach processing cores.

FIG. 5 shows an example of repeatable pattern 500 for the 25 Gbps long reach example. The repeatable pattern 500 includes an instance of the connection pattern 300, and an instance of an adjacent complementary pattern 502. The complementary pattern 502 has the same number of rows and columns as the connection pattern 300, and extends the connection pattern 300 in a manner that makes the repeatable pattern 500 meet the applicable design rules noted above. Multiple instances of the repeatable pattern 500 may FIG. 8 shows an example of repeatable pattern 800 for the 15 Gbps long reach example. The repeatable pattern 800 includes an instance of the connection pattern 700, and an instance of an adjacent complementary pattern 802. The complementary pattern 802 has the same number of rows and columns as the connection pattern 700, and extends the connection pattern 700 in a manner that makes the repeatable pattern 800 meet the applicable design rules noted above. Multiple instances of the repeatable pattern 800 may then be placed adjacent to one another in a given direction along the edge of a package, to support additional sets of cores in multiples of four.

Figure 9:
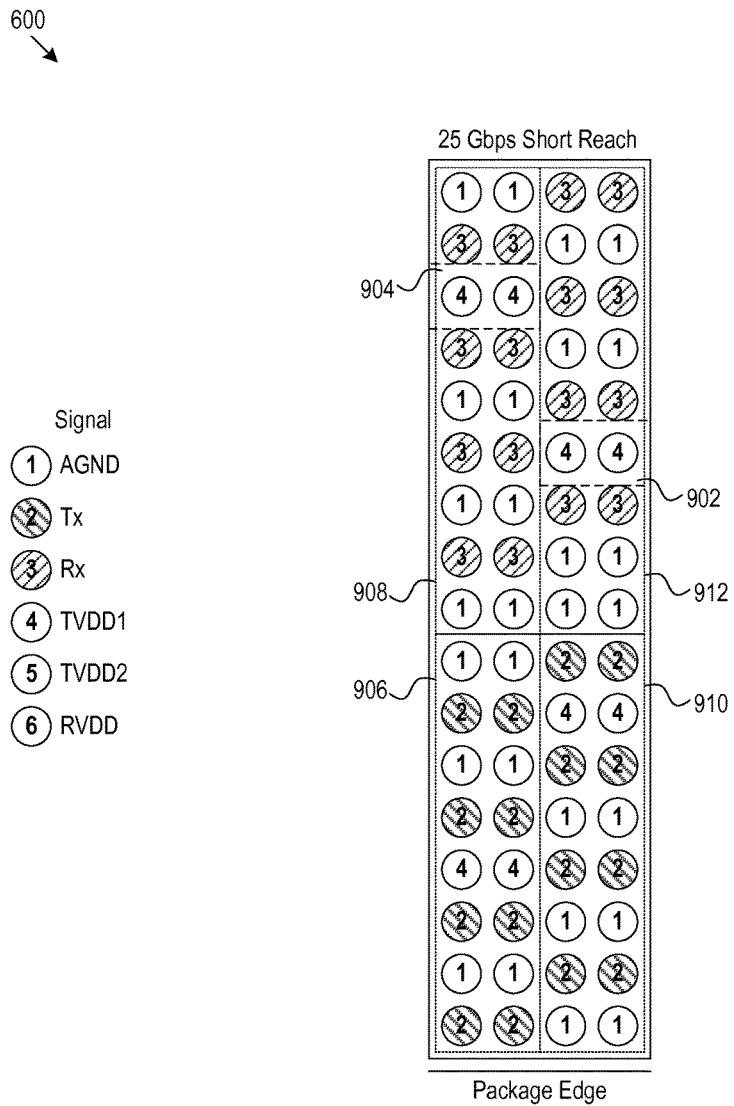
FIG. 9 is an example of a connection pattern for 25 Gbps short reach processing cores.

FIG. 9 is an example of a connection pattern for 25 Gbps short reach processing cores. This connection pattern assumes that the SERDES core uses a common VDD and AGND for both Tx and Rx. As such, the connection pattern does not include a TVDD2 net or a RVDD net. A separate RVDD may be added where indicated by the RVDD option 902 and RVDD option 904. FIG. 8 shows the Tx signals 906 and Rx signals 908 for a first core, and Tx signals 910 and Rx signals 912 for a second core.

The description above has been provided to allow a person skilled in the art to make and use the claimed inventions. The principles described above may be modified, and the principles and their variations may be applied to achieve other connection patterns and achieve other design goals. For example, given the design rules expressed above, many other permutations of connection points that form connection patterns may be implemented that also meet any given set of signal specifications. That is, the description and drawings provide examples of the inventions, and the inventions are not limited to only the specific examples provided.

What is claimed is:

1. A semiconductor package comprising:
   connective elements comprising:
      paired transmit elements;
      paired receive elements;
      ground elements; and
      power supply elements;
   the connective elements disposed in rows and columns, including:
      an edge row configured to run adjacent to a semiconductor package edge, and wherein none of the power supply elements are in the edge row.

2. The semiconductor package of claim 1, wherein:
   the power supply elements comprise individual power supply connective elements, and
   each power supply connective element among the power supply elements is in an adjacency free configuration with respect to each other power supply connective element among the power supply elements.

3. The semiconductor package of claim 2, wherein:
   the adjacency free configuration comprises: no vertical adjacency.

4. The semiconductor package of claim 2, wherein:
   the adjacency free configuration comprises: no horizontal adjacency.

5. The semiconductor package of claim 2, wherein:
   the adjacency free configuration comprises: no diagonal adjacency.

6. The semiconductor package of claim 2, wherein:
   the adjacency free configuration comprises: no diagonal adjacency, no horizontal adjacency, and no vertical adjacency.

7. A device comprising:
   pairs of transmit elements;
   pairs of receive elements;
   the pairs of transmit and receive elements disposed in rows and columns in which:
      each of the pairs of transmit elements is separated from remaining pairs by ground elements, power elements or both;
      each of the pairs of receive elements is separated from remaining pairs by ground elements, power elements, or both; and
      each of the power elements is separated from each of the other power elements.

8. The device of claim 7, wherein:
   the power elements are separated by ground elements.

9. The device of claim 7, wherein:
   the pairs of receive elements are vertically separated, and each of the pairs of receive elements are vertically separated.

10. The device of claim 9, wherein:
    the pairs of receive elements are vertically separated by ground elements, and each of the pairs of receive elements are vertically separated by ground elements.

11. The device of claim 10, wherein:
    the pairs of receive elements are each assigned to receive channels of a circuitry core, and the pairs of transmit elements are each assigned to transmit channels of the circuitry core.

12. The device of claim 10, wherein:
    there are at least four pairs of receive elements, each assigned to a different receive channel of a circuitry core; and
    there are at least four pairs of transmit elements, each assigned to a different transmit channel of the circuitry core.

13. The device of claim 12, wherein:
    the power elements comprise power supply connective elements for at least two different power supply voltages.

14. The device of claim 13, wherein the connective elements are disposed in at least a 3 column wide by 16 row tall array.

15. A circuit comprising:
    an array of rows and columns of connective elements comprising:
       pairs of transmit elements;
       pairs of receive elements; and
       power supply elements for at least two different power supply voltages;
    within the rows:
       an edge row configured to run adjacent to a semiconductor package edge, wherein none of the power supply elements are in the edge row; and
    within the array:
       the power supply elements for the different power supply voltages arranged in a non-adjacent configuration.

16. The circuit of claim 15, wherein:
    the non-adjacent configuration comprises:
    no diagonal adjacency, no vertical adjacency, and no horizontal adjacency.

17. The circuit of claim 15, wherein:
    each of the pairs of receive elements are non-adjacent horizontally and vertically.

18. The circuit of claim 17, wherein:
    each of the pairs of receive elements are also non-adjacent diagonally.

19. The circuit of claim 18, wherein:
    each of the pairs of transmit elements are non-adjacent horizontally and vertically.

20. The circuit of claim 19, wherein:
    power supply elements for the different power supply voltages are disposed in a non-adjacent configuration horizontally, vertically, and diagonally relative to one another.

* * * * *